United States Patent
Tanoi

[19]

[11] Patent Number: 5,237,213
[45] Date of Patent: Aug. 17, 1993

[54] SEMICONDUCTOR INTEGRATED CIRCUIT WITH LOW-NOISE OUTPUT BUFFERS

[75] Inventor: Satoru Tanoi, Tokyo, Japan

[73] Assignee: Oki Electric Industry Co., Ltd., Tokyo, Japan

[21] Appl. No.: 869,257

[22] Filed: Apr. 15, 1992

[30] Foreign Application Priority Data

Apr. 15, 1991 [JP] Japan ................. 3-082709

[51] Int. Cl.$^5$ ................. H03K 3/29; H03K 17/687
[52] U.S. Cl. ................. 307/290; 307/572
[58] Field of Search ................. 307/443, 263, 572, 290

[56] References Cited

U.S. PATENT DOCUMENTS

| | | | |
|---|---|---|---|
| 4,818,901 | 4/1989 | Young et al. | 307/451 |
| 4,961,010 | 10/1990 | Davis | 307/443 |
| 5,003,205 | 3/1991 | Kohda et al. | 307/443 |
| 5,057,711 | 10/1991 | Lee et al. | 307/443 |
| 5,063,308 | 11/1991 | Borkar | 307/443 |
| 5,097,149 | 3/1992 | Lee | 307/263 |

FOREIGN PATENT DOCUMENTS

| | | |
|---|---|---|
| 0199374 | 10/1988 | European Pat. Off. . |
| 1196921 | 10/1985 | Japan . |
| 61-216518 | 9/1986 | Japan . |
| 488061 | 8/1987 | Japan . |
| 3-169115 | 7/1991 | Japan . |

*Primary Examiner*—Jin F. Ng
*Assistant Examiner*—Sinh Tran
*Attorney, Agent, or Firm*—Edward D. Manzo; John J. King

[57] ABSTRACT

A semiconductor integrated circuit has output buffers connected in parallel between one or more upper potential lines and one or more lower potential lines. Each output buffer has an output terminal coupled by first and third switching circuits to upper potential lines, and by second and fourth switching circuits to lower potential lines. In the high output state the first switching circuit is switched on, then the third switching circuit is switched on. In the low output state the second switching circuit is switched on, then the fourth switching circuit is switched on. An upper voltage threshold element switches the first switching circuit off above a first threshold output potential. A lower voltage threshold element switches the second circuit off below a second threshold output potential.

18 Claims, 5 Drawing Sheets

| ENABLE | DATA | N 33 | N 35 | N 36 | N 34 |
|--------|------|------|------|------|------|
| LOW  | LOW  | LOW  | HIGH | LOW  | HIGH |
| LOW  | HIGH | LOW  | HIGH | LOW  | HIGH |
| HIGH | LOW  | LOW  | HIGH | HIGH | LOW  |
| HIGH | HIGH | HIGH | LOW  | LOW  | HIGH |

SEMICONDUCTOR INTEGRATED CIRCUIT WITH LOW-NOISE OUTPUT BUFFERS

BACKGROUND OF THE INVENTION

This invention relates to a semiconductor integrated circuit with improved output buffer circuits, resulting in reduced switching noise at output terminals.

Various output buffer circuits can be found in the prior art. The simplest comprises a pair of transistors coupling an output terminal to an upper potential supply line and a lower potential supply line. When the first transistor is switched on and the second is switched off, the output terminal is in the high output state, providing the upper potential to an external load. When the first transistor is switched off and the second is switched on, the output terminal is in the low output state, providing the lower potential to the external load. When both transistors are switched off, the output terminal is in the high-impedance state.

When switched between the high and low output states, this simple output buffer generates a large flow of charge or discharge current on the upper or lower potential supply line, resulting in switching noise. As the speed and current driving ability of output buffers has increased, incorrect circuit operation due to such switching noise has become a major problem.

Japanese Patent Kokai Publication 1087/48806 discloses a prior-art scheme for reducing output buffer switching noise, which is to couple the output terminal to the upper potential supply line through two or more transistors in parallel, and couple the output terminal to the lower potential supply line through two or more transistors in parallel. The switch-on times of these transistors are staggered, thereby reducing noise by restricting charge and discharge current flow.

This prior-art scheme has not proven entirely successful, however. When a large number of output buffers are switched simultaneously from the high to the low output state, for example, they generate a large total discharge current from their loads to the lower potential line. The resulting noise can propagate to other output buffers that are being held in the low output state. Resonance between stray inductance and capacitive loads of the other output buffers may produce an output noise voltage exceeding the peak noise voltage on the lower potential line, disrupting the operation of circuits being driven by those output buffers.

SUMMARY OF THE INVENTION

It is accordingly an object of the present invention to reduce switching noise at output terminals of a semiconductor integrated circuit.

In one aspect of the invention, a semiconductor integrated circuit has at least two upper potential lines for supplying a certain upper potential, at least two lower potential lines for supplying a certain lower potential, and a plurality of output buffers connected in parallel between the upper potential lines and the lower potential lines.

Each output buffer comprises an output terminal, first switching means for coupling the output terminal to one of the upper potential lines, second switching means for coupling the output terminal to one of the lower potential lines, third switching means for coupling the output terminal to another one of the upper potential lines, and fourth switching means for coupling the output terminal to another one of the lower potential lines.

To place the output terminal in the high output state, a control means switches the first switching means on and the second and fourth switching means off, then after a certain delay switches the third switching means on. To place the output terminal in the low output state, the control means switches the first and third switching means off and the second switching means on, then after a certain delay switches the fourth switching means on.

An upper voltage threshold means switches the first switching means off when the output terminal goes above a first threshold potential intermediate between the upper potential and the lower potential. A lower voltage threshold means switches the second switching means off when the output terminal goes below a second threshold potential intermediate between the upper potential and the lower potential.

In an alternative aspect of the invention, the first and third switching means both couple the output terminal to the same upper potential line and the upper voltage threshold means is omitted. Only one upper potential line is necessary in this case.

In a different alternative aspect of the invention, the second and fourth switching means both couple the output terminal to the same lower potential line and the lower voltage threshold means is omitted. Only one lower potential line is necessary in this case.

DETAILED DESCRIPTION OF THE INVENTION

A semiconductor integrated circuit with novel output buffers will be described with reference to the attached drawings. To avoid obscuring the invention with irrelevant detail, the drawings will show only the output buffer circuits and associated potential supply lines and loads. The drawings furnish illustrations of the invention but do not restrict its scope, which should be determined solely from the appended claims.

Figure 1:
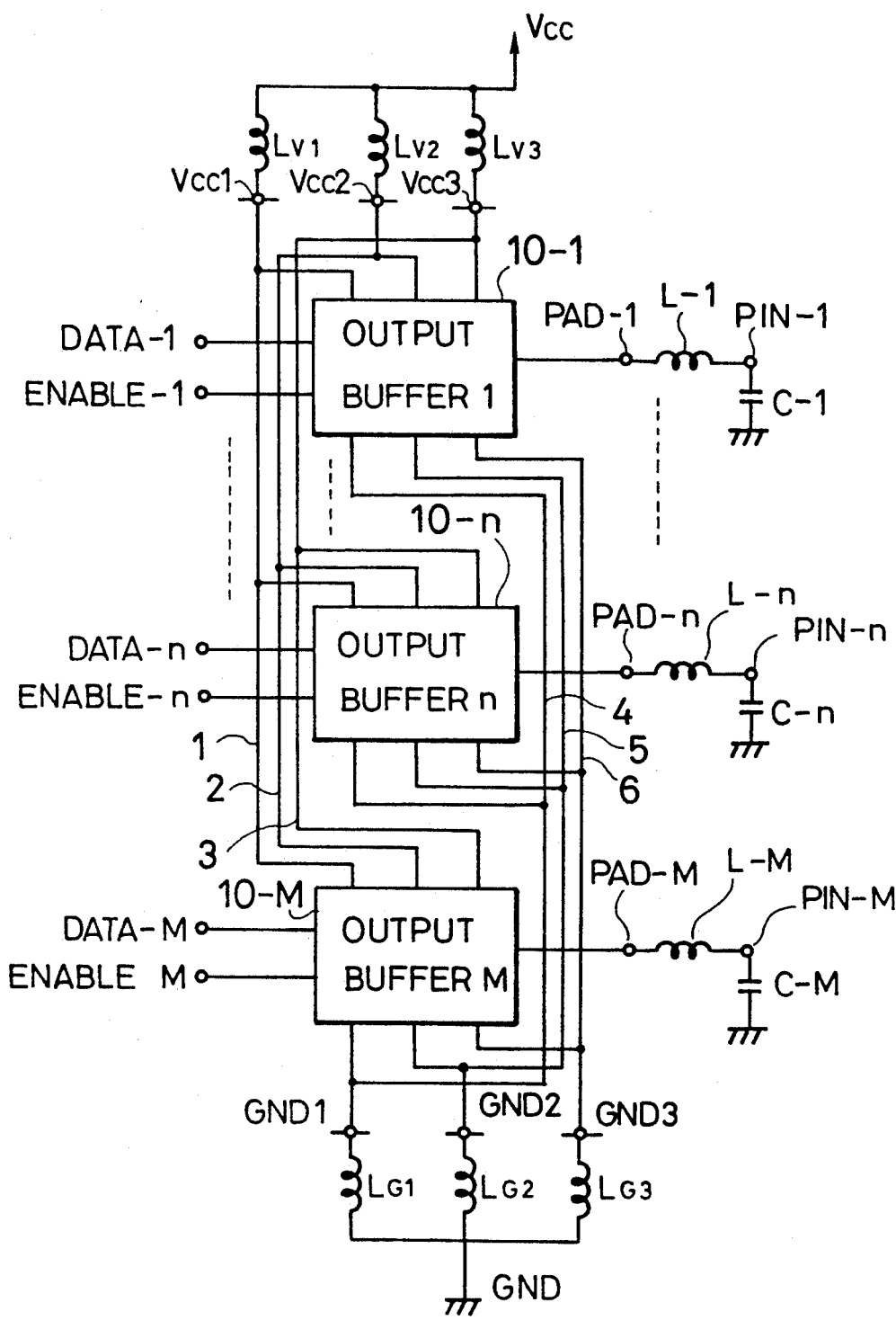
FIG. 1 is a partial circuit diagram of the invented semiconductor integrated circuit.

Referring to FIG. 1, the semiconductor integrated circuit is externally supplied with an upper potential from an external terminal denoted Vcc and with a lower potential from an external terminal denoted GND. Vcc and GND are, for example, the power supply plane and ground plane of a printed circuit board or other carrier on which the semiconductor integrated circuit is mounted. In the subsequent description it will be assumed that the upper potential is five volts and the lower potential is zero volts, but the invention is of course not limited to these specific values.

The upper potential is branched from Vcc onto three upper potential lines 1, 2, and 3 that run through nodes Vcc1, Vcc2, and Vcc3. The lower potential is branched from GND onto three lower potential lines 4, 5, and 6, running through nodes GND1, GND2, and GND3. Vcc1, Vcc2, Vcc3, GND1, GND2, and GND3 are, for example, power supply and ground bonding pads on a semiconductor chip on which the semiconductor integrated circuit is fabricated.

A plurality of output buffers 10-1, ... 10-n, 10-M are coupled in parallel between the upper potential lines 1, 2, and 3 and the lower potential lines 4, 5, and 6. (The letter n denotes an arbitrary integer greater than one. There may be more output buffers than the n+1 indicated in the drawing.) Instead of speaking of the output buffers 10-1 ... 10-n. 10-M as being connected between the upper potential lines 1, 2, and 3 and lower potential lines 4, 5, and 6, they can be equivalently described as coupled in parallel between nodes Vcc1, Vcc2, and Vcc3 and nodes GND1, GND2, and GND3. This shorter notation will be used in the subsequent description of the invention.

Each of the output buffers 10-1 ... 10-n, 10-M has a data input terminal, an enable input terminal, and an output pad and pin. These are identified in the drawing by the symbols DATA-1, ... , DATA-n, DATA-M, ENABLE-1, ... , ENABLE-n, ENABLE-M, PAD-1, ... , PAD-n, PAD-M, and PIN-1, ... , PIN-n, PIN-M. In general the data and enable input terminals are internal nodes of the semiconductor integrated circuit, the output pads are bonding pads of the semiconductor chip on which the semiconductor integrated circuit is fabricated and the output pins are external pins or leads of a package in which the semiconductor integrated circuit is housed.

Stray inductances $L_{V1}$ to $L_{V3}$ exit between the external terminal Vcc and respective nodes Vcc1 to Vcc3. There are also stray inductances $L_{G1}$ to $L_{G3}$ between the external terminal GND and nodes GND1 to GND3, and stray inductances L-1, ... , L-n, L-M between the output pads PAD-1, ... , PAD-n, PAD-M and the output pins PIN-1, ... , PIN-n, PIN-M. External capacitive loads C-1 to C-n and C-M of, for example, fifty to a few hundred picofarads are connected between the output pins PIN-1, ... , PIN-n, PIN-M and the lower potential (zero volts).

Figure 2:
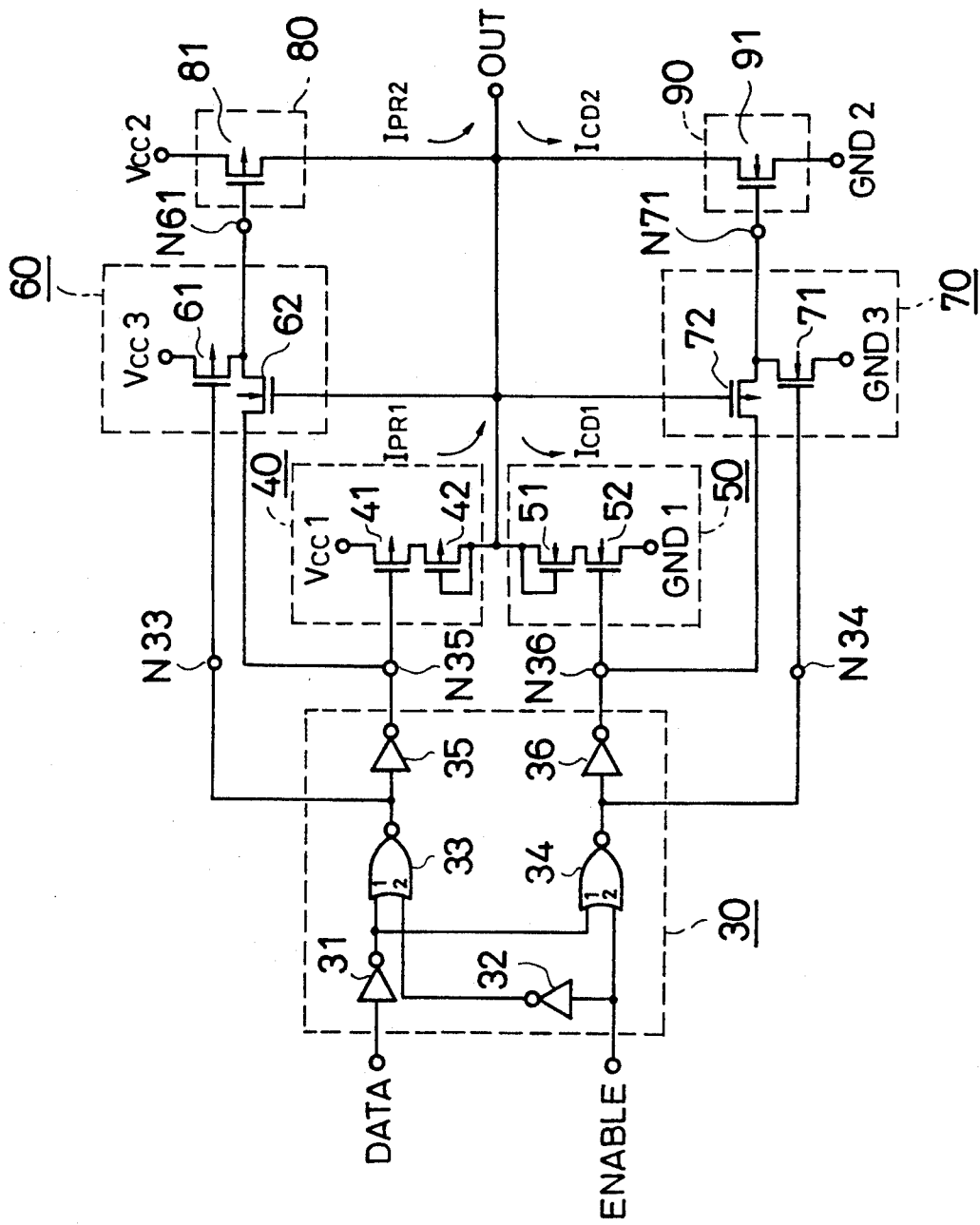
FIG. 2 is a schematic diagram of an output buffer in FIG. 1.

Referring next to FIG. 2, each of the output buffers 10-1, ... , 10-n, 10-M in FIG. 1 comprises a logic circuit 30, a first switching circuit 40, a second switching circuit 50, a first delay circuit 60, a second delay circuit 70, a third switching circuit 80, and a fourth switching circuit 90. The control means referred to in the summary of the invention comprises the logic circuit 80 and delay circuits 60 and 70. The output buffer is connected to an output terminal OUT which is coupled to a corresponding output pad (PAD-1, ... , PAD-n, or PAD-M) in FIG. 1.

The logic circuit 30 is coupled to a data input terminal (DATA-1, ... , DATA-n, or DATA-M in FIG. 1) and an enable input terminal (ENABLE-1, ... , ENABLE-n or ENABLE-M in FIG. 1), and produces high and low outputs at nodes N33, N34, N35, and N36. The word "high" refers herein to a voltage substantially equal to the upper potential (five volts); the word "low" refers to a voltage substantially equal to the lower potential (zero volts).

The logic circuit 30 comprises a pair of inverters 31 and 82 that invert a data signal and an enable signal received at the data and enable input terminals, a NOR gate 32 that receives the inverted data and enable signals from these inverters, a NAND gate 84 that receives the enable signal and the inverted data signal and inverters 35 and 36 that invert the outputs of the NOR gate 33 and the NAND gate 34. The output of the NOR gate 33 drives node N33, the output of the NAND gate 34 drives node N34, the output of the inverter 35 drives node N35, and the inverted output of the inverter 36 drives node N36. Although this is not indicated in the drawing, the control circuit 30 is powered from Vcc3 and GND3.

The logic circuit 30 is not limited to the configuration shown in FIG. 1. Any circuit configuration that produces equivalent outputs at nodes N33, N34, N35, and N36 can be used. If negative output logic is desired, the inverter 31 can be omitted.

The first switching circuit 40 comprises a pair of p-channel enhancement-type metal-oxide-semiconductor field-effect transistors (hereinafter, P-MOS transistors) 41 and 42 connected in series between Vcc1 and the output terminal OUT. The source electrode of the P-MOS transistor 41 is connected to Vcc1, and its gate electrode is connected to node N35. The source electrode of the P-MOS transistor 42 is connected to the drain electrode of the P-MOS transistor 41. The gate and drain electrodes of the P-MOS transistor 42 are both connected to the output terminal OUT.

The source electrode, gate electrode, and drain electrode will be referred to below as simply the source, gate, and drain.

The second switching circuit 50 comprises a pair of n-channel enhancement-type metal-oxide-semiconductor field-effect effect transistors (hereinafter, N-MOS transistors) 51 and 52 connected in series between GND1 and the output terminal OUT. The gate and drain of the N-MOS transistor 51 are both connected to the output terminal OUT, and its source is connected to the drain of the N-MOS transistor 52. The gate of the N-MOS transistor 52 is connected to node N36, and its source is connected to GND1.

The first delay circuit 60 comprises a P-MOS transistor 61 and an N-MOS transistor 62. The source of the P-MOS transistor 61 is connected to Vcc3, its gate is connected to node N33, and its drain is connected to a node N61. The drain of the N-MOS transistor 62 is connected to node N35, its gate is connected to the output terminal OUT, and its source is connected to node N61.

The second delay circuit 70 comprises an N-MOS transistor 71 and a P-MOS transistor 72. The gate of the N-MOS transistor 71 is connected to node N34, its source is connected to GND3, and its drain is connected to a node N71. The gate of the P-MOS transistor 72 is connected to the output terminal OUT, its source is connected to node N36, and the drain of which is connected to node N71.

The first and second delay circuit 60 and 70 are not limited to the circuit configuration shown in the drawing. Other well-known delay circuits, such as an even number of inverters connected in series, may be used instead.

The third switching circuit 80 comprises a single P-MOS transistor 81 the gate of which is connected to node N61, the source of which is connected to Vcc2, and the drain of which is connected to the output terminal OUT.

The fourth switching circuit 90 comprises a single N-MOS transistor 91 the gate of which is connected to node N71, the drain of which is connected to the output terminal OUT, and the source of which is connected to GND2.

Next the operation of the individual circuit blocks in FIG. 2 will be described.

The operation of the logic circuit 30 will be readily apparent to those skilled in the art. Instead of a detailed description, a summary is given in FIG. 3, which lists all states of the enable and data input signals and the corresponding outputs at nodes N33, N34, N35, and N36.

In the first switching circuit 40, the P-MOS transistors 41 and 42 conduct current when their source potential exceeds their gate potential by at least a value Vtp, typically about 0.8 volts. The source potential of the P-MOS transistor 41 is the upper potential at Vcc1 and its gate potential is the potential at node N35, so the P-MOS transistor 41 is a switching element that switches on when node N35 is low and off when node N35 is high.

When the P-MOS transistor 41 is on, the source potential of the P-MOS transistor 42 is the upper potential at Vcc1 and the gate potential is the potential Vout of the output terminal OUT. The P-MOS transistor 42 is therefore on when Vout<Vcc1−Vtp and off when Vout<Vcc1−Vtp, where Vcc1 here represents the upper potential at node Vcc1.

The P-MOS transistor 42 is thus an upper voltage threshold element that switches the first switching circuit 40 from the on state to the off state when the potential Vout of the output terminal OUT rises above a first threshold value Vcc1−Vtp. The first threshold value is intermediate between the upper potential (five volts) and lower potential (zero volts). If Vcc1 is five volts, the first threshold potential is about 4.2 volts.

To summarize, the first switching circuit 40 is on when node N35 is low and Vout is at least 0.8 volts lower than Vcc1, and is off at other times.

In the second switching circuit 50, the N-MOS transistor 51 and 52 conduct current when their gate potential exceeds their source potential by at least a value Vtn, typically about 0.8 volts. The the N-MOS transistor 52 is thus a switching element that is off when node N36 is low and on when node N36 is high.

When the N-MOS transistor 52 is on, the N-MOS transistor 51 acts as a lower voltage threshold element that conducts when Vout>GND1+Vtn, where GND1 is the potential at node GND1, but turns off when Vout<GND1+Vtn. The value GND1+Vtn is a second threshold voltage intermediate between the lower potential (zero volts) and the upper potential (five volts). If GND1 is zero volts, the second threshold potential is about 0.8 volts.

To summarize, the second switching circuit 50 is on when node N36 is high and Vout is at least 0.8 volts higher than GND1, and is off at other times.

The operation of the first delay circuit 60 and third switching circuit 80 will be described together. When node N33 is low, the P-MOS transistor 61 is on, coupling node N61 to Vcc3. Node N61 may also be coupled through the transistor 62 to node N35, which is high. In any case, N61 is high and the third switching circuit (the P-MOS transistor 81) is switched off.

When node N33 is high, the P-MOS transistor 61 if off and node N61 is not coupled to Vcc3. If the potential Vout of the output terminal OUT is greater than about 0.8 volts the N-MOS transistor 62 turns on, coupling node N61 to node N33 which is low, thus turning on the P-MOS transistor 81. The third switching circuit 80 then turns on and couples the output terminal OUT to Vcc2.

The operation of the second delay circuit 70 and fourth switching circuit 90 is analogous. When node 34 is high, node N71 is coupled to GND3 and the fourth switching circuit 90 is off. When node N35 is low, if Vout is less than about 4.2 volts node N71 is coupled to node N36 and the fourth switching circuit 90 turns on, coupling the output terminal OUT to GND2.

Next the overall static operation of the output buffer in FIG. 2 will be described.

When the enable input signal is low, nodes N33 and N36 are low and Nodes N34 and N35 are high, so the first, second, third, and fourth switching circuits 40, 50, 80, and 90 are all switched off as explained above. The output terminal OUT is in the high-impedance state, coupled neither to Vcc nor to GND.

When the enable input signal is high, the operation depends on the data input signal.

When the data signal is low, node N33 is low and node N35 is high, so the first and third switching circuits 40 and 80 are switched of as explained above. Node N36 is high, so if Vout is greater than about 0.8 volts the first switching circuit 50 is switched on, coupling the output terminal OUT to GND1. Moreover, if Vout is less than about 4.2 volts the fourth switching circuit switches on, coupling the output terminal OUT to GND2. Regardless of the value of Vout, at least one of the conditions Vout>0.8 volts and Vout<4.2 volts is necessarily satisfied, so the output terminal OUT is coupled to GND1 or GND2 or possibly both. Vout therefore falls to zero volts. In this state the second switching circuit 50 switches off but the fourth switching circuit 90 remains on, holding the output terminal OUT coupled to GND2 and thus held in the low output state at zero volts.

When the data input is high the operation is exactly the reverse. The second and fourth switching circuit are switched off. The first switching circuit is switched on if Vout is less than about 4.2 volts and the third switching circuit is switched on if Vout is greater than about 0.8 volts, so the output terminal OUT is coupled to Vcc1 or Vcc2 (or both) and its potential rises to the upper potential of five volts. In this state the first switching circuit 40 switches off but the third switching circuit 80 remains on, coupling the output terminal OUT to Vcc2 and holding it in the high output state at five volts.

Next the operation of the output buffer in FIG. 2 in switching from the high output state to the low output state will be described.

Initially the data and enable inputs are both high, the first, second, and fourth switching circuits 40, 50, and 90 are off, the third switching circuit 80 is on, the output terminals OUT is coupled to Vcc2, and the output potential Vout is high (five volts).

When the data input signal changes from high to low, the third switching circuit 90 immediately switches off as explained above, decoupling the output terminal OUT from Vcc2. In the second switching circuit 50 the N-MOS transistor 52 switches on, and since Vout is high the N-MOS transistor 51 is also on, so the second switching circuit 50 is on and the output terminal OUT is coupled to GND1. A large current $I_{CD1}$ flow briefly through the second switching circuit 50 to GND1 as the capacitive load coupled to the output terminal OUT discharges. Due to this discharge, the potential Vout of the output terminal OUT begins to fall.

When Vout falls below about 4.2 volts, the P-MOS transistor 72 turns on, mutually coupling nodes N36 and N71, and the gate of the N-MOS transistor begins to charge from node N36, which is at the high level. The charging takes time, because the P-MOS transistor 72 admits a current of only a few microamperes and the N-MOS transistor 91 has a large gate capacitance. (To assure a sink current of 12 mA at a low output voltage of 0.4 volts, for example, the gate width and length of the N-MOS transistor 91 are about 500 μm and 1 μm, making the gate capacitance about one picofarad.) The potential at node N71 does not begin to rise appreciably until the output potential Vout is about Vcc=2Vtp, or 3.4 volts. The potential rise of node 71 takes place mainly while Vout, which is also the gate potential of the P-MOS transistor 72, is falling from about 3.4 volts to two volts. In this range of P-MOS transistor 72 has considerable on-state resistance, which further delays the charging process. Overall, it takes node N71 about twice as long as node N36 to reach the high level (five volts), at which the N-MOS transistor 91 is fully turned on.

When the N-MOS transistor 91 does turn on, a discharge current $I_{CD2}$ flows from the output terminal OUT through the fourth switching circuit 90 to GND2. Since the load coupled to the output terminal OUT has already mainly discharged through the second switching circuit 50, however, the current $I_{CD2}$ is only about one-half or one-third as much as $I_{CD1}$. Moreover, since the rise time of the gate potential (node N71) of the N-MOS transistor 91 in the fourth switching circuit 90 is about twice as long as the rise time of the gate potential (node N36) of the N-MOS transistor 52 in the second switching circuit 50, the discharge to GND2 occurs more slowly than the discharge to GND1. If if t represents time, then $d(I_{CD2})/dt$ is less than $d(I_{CD1})/dt$.

When the potential Vout of the output terminal OUT falls below about 0.8 volts, the lower voltage threshold element (the N-MOS transistor 51) turns the second switching circuit 50 off, but by this time the fourth switching circuit 90 has turned on completely and continues to pull Vout down to zero volts.

The operation during switching from the output state to the high output state is similar so a detailed description will be omitted. A large charge current $I_{PR1}$ flows initially from Vcc1 through the first switching circuit 40 to the output terminal OUT. A delayed and much smaller charge current $I_{PR2}$ flows from Vcc2 through the third switching circuit 80 to the output terminal OUT.

Next the dynamic operation will be described for the case in which the output buffer 10-M in FIG. 1 is held in the low output state while output buffers 10-1, . . . , 10-n are switched simultaneously from the high output state to the low output state. This is a case that caused noise problems in the prior art.

Figures 3, 4:
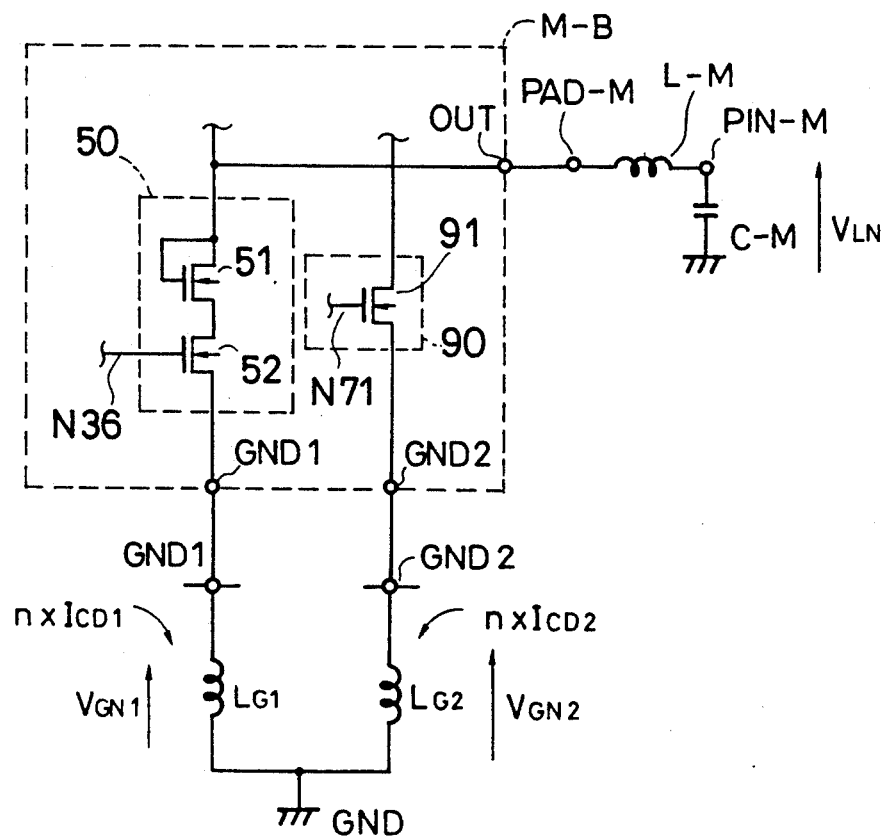
FIG. 3 is a truth table summarizing the operation of the logic circuit in FIG. 2.
FIG. 4 is a partial schematic diagram of an output buffer and associated circuits in FIG. 1.

The output buffer 10-M and its associated circuits are partially redrawn in FIG. 4. When the output buffers 10-1, . . . , 10-n are switched simultaneously from high to low output, a large discharge current $n \times I_{CD1}$ flow initially from their capacitive loads C-1, . . . , C-n to GND1 as explained above. This induces a large counter voltage in the stray inductance $L_{G1}$ between GND1 and GND, causing a large noise voltage $V_{GN1}$ at node GND1. After a certain delay, a smaller discharge current of $n \times I_{CD2}$ flows to GND2, causing a smaller noise voltage $V_{GN2}$ at node GND2.

Since the output buffer 10-M is being held in the low output state, its second switching circuit 50 is off (the N-MOS transistor 52 is on but the N-MOS transistor 51 is off), so the noise voltage $V_{GN1}$ does not reach the output terminal OUT. Even if the output potential Vout of the output buffer 10-M is not zero volts but slightly higher, so that the N-MOS transistor 51 is in a partially conducting state, the potential rise at GND1 caused by the noise voltage $V_{GN1}$ tends to switch the N-MOS transistor 51 off completely. It will be recalled that N-MOS transistor 51 turns off when $$\text{Vout} < \text{GND1} + \text{Vtn} = V_{GN1} + \text{Vtn}.$$

The higher the noise voltage $V_{GN1}$, the more difficult it becomes for the N-MOS transistor 51 to turn on.

Thus it is only the smaller noise voltage $V_{GN2}$ at GND2 that propagates to the output terminal OUT, through the fourth switching circuit 90. Noise $V_{LN}$ at the output pin PIN-M is accordingly reduced to a fraction of the level in the prior art, even is boosted by resonance between the stray inductance L-M and capacitive load C-M.

Figure 5:
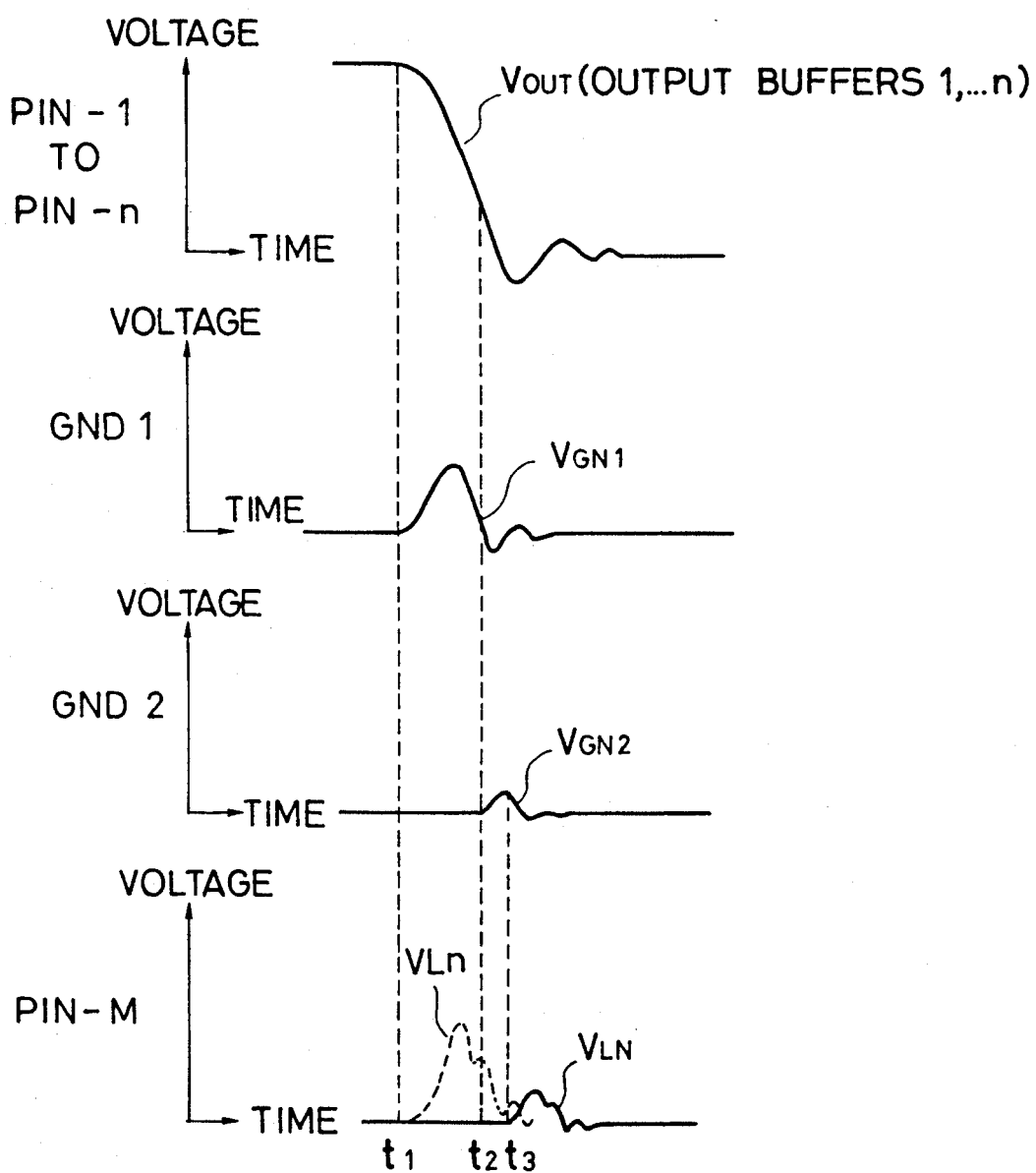
FIG. 5 is a waveform diagram illustrating switching noise.

FIG. 5 shows waveforms of the output voltage Vout of the output buffers 10-1, . . . , 10-n, the noise voltage $V_{GN1}$ at GND1, the noise voltage $V_{GN2}$ at GND2, and the noise voltage $V_{LN}$ at the output pin PIN-M of buffer M. In the output buffers 10-1, . . . , 10-n, the second switching circuits 50 switch on at time $t_1$ and the fourth switching circuits 90 switch on at time $t_2$. Noise VLN begins to appear at the output pin PIN-M of buffer M at time $t_3$.

FIG. 5 illustrates the case in which resonance between the stray inductance L-M and the capacitive load C-M causes the noise voltage $V_{LN}$ at the output pin PIN-M to exceed the noise voltage $V_{GN2}$ at GND2. Even so, the noise voltage $V_{LN}$ is much less than the noise voltage VLn that would occur if the noise $V_{GN1}$ at GND1 were permitted to propagate to the output pin PIN-M as in the prior art.

The case in which the output buffer M is holding the high output state and the output buffers 10-1 . . . , 10-n are switched from the low to the high output state is analogous, so a detailed description will be omitted. The noise-reducing effect of the invention is the same.

Figure 6:
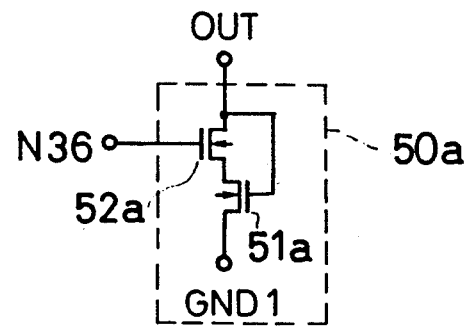
FIG. 6 is a schematic diagram illustrating a modification of the second switching circuit in FIG. 2.

FIG. 6 shows a modification of the second switching circuit in which the positions of the switching element and the lower voltage threshold element are reversed. The lower voltage threshold element in FIG. 6 is an N-MOS transistor 51a the gate of which is coupled to the output terminal OUT. the source of which is coupled to the ground line GND1, and the drain of which is coupled to the source of an N-MOS transistor 52a. The N-MOS transistor 52a is the switching element. The drain of the N-MOS transistor 52a is coupled to the output terminal OUT and its gate is coupled to node N36. The N-MOS transistors 51a and 52a in FIG. 6 switch on and off in the same way as the N MOS transistors 51 and 52 in FIG. 1, so this second switching circuit 50a has the same effect as the second switching circuit 50 in FIG. 1.

Figure 7:
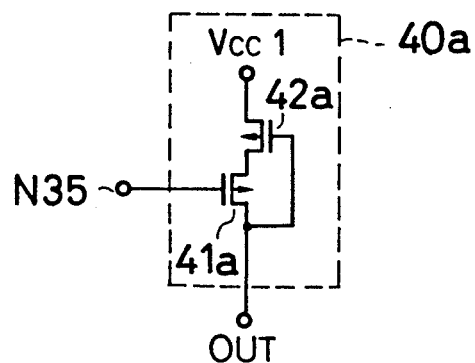
FIG. 7 is a schematic diagram illustrating a modification of the first switching circuit in FIG. 2.

FIG. 7 shows a similar modification of the first switching circuit in which the positions of the switching element and the upper voltage threshold element are reversed. The upper voltage threshold element in FIG.

7 is a P-MOS transistor 42a the gate of which is coupled to the output terminal OUT, the source of which is coupled to Vcc1, and the drain of which is coupled to the source of an N-MOS transistor 41a. The N-MOS transistor 41a is the switching element. The drain of the N-MOS transistor 41a is coupled to the output terminal OUT. and its gate is coupled to node N35. The N-MOS transistors 41a and 42a in FIG. 7 switch on and off in the same way as the N-MOS transistors 41 and 42 in FIG. 1, so this first switching circuit 40a has the same effect as the first switching circuit 40 in FIG. 1.

Figure 8:
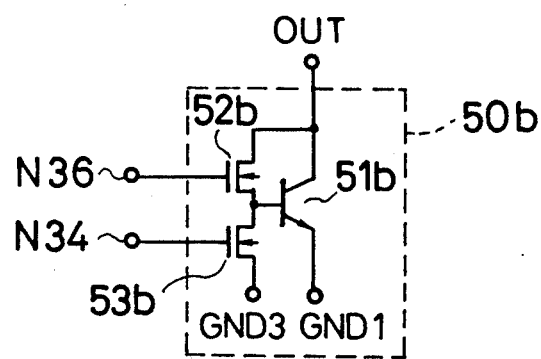
FIG. 8 is a schematic diagram illustrating another modification of the second switching circuit in FIG. 2.

FIG. 8 shows another modification of the second switching circuit. In this second switching circuit 50b the lower voltage threshold element is an n-p-n bipolar transistor 51b. the collector electrode of which is coupled to the output terminal OUT and the emitter electrode of which is coupled to GND1. The base electrode of the bipolar transistor 51b is coupled to the source of an N-MOS transistor 52b and the drain of an N-MOS transistor 53b. The drain of the N-MOS transistor 52b is coupled to the output terminal OUT and its gate is coupled to node N36. The source of the N-MOS transistor 53b is coupled to GND3 and its gate is coupled to node N34.

The emitter electrode, base electrode, and collector electrode will referred to below as simply the emitter, base, and collector.

The bipolar transistor 51b turns on when its base potential exceeds its emitter potential by at least the forward base-emitter junction voltage $V_{BE}$, typically about 0.7 volts. When node N34 is high and N36 is low (the disabled state or high output state of the output buffer). the base of the bipolar transistor 51b is coupled through the N-MOS transistor 53b to GND3, so the bipolar transistor 51b is switched off. The N-MOS transistor 52b is also off, so the second switching circuit 50b is switched off; the output terminal OUT is decoupled from both GND1 and GND3.

When node N34 is low and node N36 is high (the low output state of the output buffer). the base of the bipolar transistor 51b is coupled through the N-MOS transistor 52b to the output terminal OUT. In this state the bipolar transistor 52b switches on when Vout>GND1+$V_{BE}$, and switches off when Vout falls below GND1+$V_{BE}$. It therefore provides the same voltage threshold function as the N-MOS transistor 51 in FIG. 1, GND1+$V_{BE}$ replacing GND1+Vtn as the second threshold voltage. As before, by raising the GND1 potential, switching noise at GND1 tends to switch the bipolar transistor 51b off.

Figure 9:
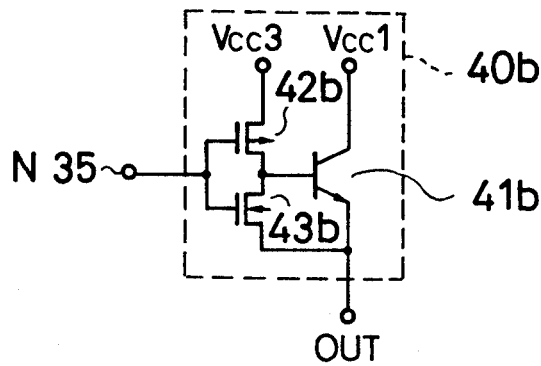
FIG. 9 is a schematic diagram illustrating another modification of the first switching circuit in FIG. 2.

FIG. 9 shows another modification of the first switching circuit. In this first switching circuit 40b the upper voltage threshold element is an n-p-n bipolar transistor 41b the collector of which is coupled to Vcc1 and the emitter of which is coupled to the output terminal OUT. The base of the bipolar transistor 40b is coupled to the drain of a P-MOS transistor 42b and the drain of an N-MOS transistor 42b. The gates of the P-MOS transistor 42b and the N-MOS transistor 42b are both coupled to the node NS3, the source of the P-MOS transistor 42b is coupled to Vcc3, and the source of the N-MOS transistor 48b is coupled to the output terminal OUT.

If node N35 is high (the disabled state or low output state of the output buffer), the base of the bipolar transistor 41b is coupled through the N-MOS transistor 43b to the emitter. Since its base and emitter are at the same potential, the bipolar transistor 41b is switched off. The P-MOS transistor 42b is also off, so the switching circuit 40b is switched off.

If node N35 is low (the high output state of the output buffer), the base of the bipolar transistor is coupled through the P-MOS transistor 42b to Vcc3. In this state the bipolar transistor 41b is on when Vcc3>Vout+$V_{BE}$, that is, when Vout<Vcc3−$V_{BE}$, where Vcc3 represents the potential of node Vcc3. If Vout rises above Vcc3−$V_{BE}$, the bipolar transistor 41b switches off. The bipolar transistor 41b therefore provides a voltage threshold function similar to that of the P-MOS transistor 42 in FIG. 1, Vcc3−$V_{BE}$ replacing Vcc1−Vtp as the first threshold voltage.

In the high output state in FIG. 9, if switching noise from other output buffers lowers the potential at Vcc1, the base-collector junction of the bipolar transistor 41b becomes forward biased. Reverse current may then flow from Vcc3 through the base and collector of the bipolar transistor 41b to Vcc1. This reverse current flow is attenuated by the P-MOS transistor 42b, however, and any resulting noise at Vcc3 is blocked from the output terminal OUT by the N-MOS transistor 43b, which is in the off state. By lowering the potential at Vcc3, the noise also tends to turn the bipolar transistor 43b more completely off.

Finally, possible modifications of the upper potential lines and lower potential lines and the number of switching circuits will be described.

If the semiconductor integrated circuit does not generate appreciable noise on upper potential lines 2 and 3 and lower potential lines 5 and 6 in FIG. 1, upper potential lines 2 and 3 can be combined into a single upper potential line, and lower potential lines 5 and 6 can be combined into a single line. That is, node Vcc2 can be combined with Vcc3 into a single node, supplied with the upper potential from a single package lead, and node GND2 can be combined with node GND3 into a single node, supplied with the lower potential from a single package lead.

If lower-potential noise is not a problem, all three of the lower potential lines 4, 5, and 6 can be combined; that is, nodes GND1, GND2, and GND3 can all be combined into a single node supplied from a single package lead. In this case the lower voltage threshold element in FIG. 1 or FIG. 6 (the N-MOS transistor 52 or 52a) can be omitted.

If upper-potential noise is not a problem, all three of the upper potential lines 1, 2, and 3 can be combined; that is, nodes Vcc1, Vcc2, and Vcc3 can all be combined into a single node supplied from a single package lead. In this case the upper voltage threshold element in FIG. 1 or FIG. 7 (the P-MOS transistor 42 or 42a) can be omitted.

Instead of the four switching circuits in FIG. 1, the output buffer may have a larger number of switching circuits. In general, the output terminal OUT can be connected to different upper potential lines by $N_1$ switching circuits, of which the first $N_2$ are provided with upper voltage threshold elements, where $N_2$ is a positive integer and $N_1$ is another positive integer greater than $N_2$. When the output buffer is switched to the high output state, the $N_1$ switching circuits are switched on sequentially, one after another. When the high output level is reached, the first $N_2$ switching circuits switch off.

Similarly, the output terminal OUT can be connected to different lower potential lines by $N_1$ switching circuits, of which the first $N_2$ are provided with lower voltage threshold elements. When the output buffer is switched to the low output state, the $N_1$ switching circuits are switched on sequentially. When the low output level is reached, the first $N_2$ switching circuit switch off.

FIG. 1 shows the case in which $N_1=2$ and $N_2=1$.

In addition to the modifications described above, various other modifications can be made without departing from the spirit and scope of the present invention as set forth in the following claims.

What is claimed is:

1. A semiconductor integrated circuit having first and second upper potential lines for supplying a certain upper potential, first and second lower potential lines for supplying a certain lower potential, and a plurality of output buffers connected in parallel between said upper potential lines and said lower potential lines, each output buffer comprising:
an output terminal;
a first switching circuit for switchably coupling said output terminal to the first upper potential line;
a second switching circuit for switchably coupling said output terminal to the first lower potential line;
a third switching circuit for switchably coupling said output terminal to the second upper potential line;
a fourth switching circuit for switchably coupling said output terminal to the second lower potential line; and
a control circuit coupled to switch said first switching circuit on and said second switching circuit and said fourth switching circuit off, then after a certain delay to switch said third switching circuit on, thereby placing said output terminal in a high output state, and to switch said first switching circuit and said third switching circuit off and said second switching circuit on, then after a certain delay switch said fourth circuit on, thereby placing said output terminal in a low output state.

2. The circuit of claim 1, further comprising an upper voltage threshold circuit coupled to switch said first switching circuit off when said output terminal exceeds a first threshold potential intermediate between said upper potential and said lower potential.

3. The circuit of claim 1, further comprising an lower voltage threshold circuit coupled to switch said second switching circuit off when said output terminal falls below a second threshold potential intermediate between said upper potential and said lower potential.

4. The circuit of claim 2, wherein said upper voltage threshold circuit comprises a first field-effect transistor having a gate electrode coupled to said output terminal.

5. The circuit of claim 4, wherein said first switching circuit comprises a second field-effect transistor coupled in series with said first field-effect transistor between said output terminal and said one of said upper potential lines.

6. The circuit of claim 5, wherein said first field-effect transistor is coupled between said second field-effect transistor and said output terminal.

7. The circuit of claim 5, wherein said second field-effect transistor is coupled between said first field-effect transistor and said output terminal.

8. The circuit of claim 2, wherein:
said upper voltage threshold circuit comprises a bipolar transistor having an emitter electrode coupler to said output terminal, a collector electrode coupled to said one of said upper potential lines, and a base electrode; and
said first switching circuit comprises a pair of switching elements for coupling said base electrode to said output terminal in said low output state, and to another one of said upper potential lines in said high output state.

9. The circuit of claim 8, wherein said switching elements are field-effect transistors.

10. The circuit of claim 3, wherein said lower voltage threshold circuit comprises a third field-effect transistor having a gate electrode coupled to said output terminal.

11. The circuit of claim 10, wherein said first switching circuit comprises a fourth field-effect transistor coupled in series with said third field-effect transistor between said output terminal and said one of said lower potential lines.

12. The circuit of claim 11, wherein said third field-effect transistor is coupled between said fourth field-effect transistor and said output terminal.

13. The circuit of claim 11, wherein said fourth field-effect transistor is coupled between said third field-effect transistor and said output terminal.

14. A buffer circuit comprising:
first and second high potential lines respectively supplying first and second high potential signals;
first and second low potential lines respectively supplying first and second low potential signals;
an input terminal for receiving an input signal;
an output terminal;
a control circuit connected to said input terminal for generating a control signal in response to the input signal;
a first output circuit connected between said control circuit and said output terminal for outputting a first output signal to said output terminal in response to the control signal, said first output circuit including,
a first high potential supplying circuit connected between said first high potential line and said output terminal for outputting the first output signal having a potential lower than that of the first high potential signal, and
a first low potential supplying circuit connected between said first low potential line and said output terminal for outputting the first output signal having a potential higher than that of the first low potential signal;
a delay circuit connected to said control circuit and said output terminal for generating a delay signal in response to the control signal and the first output signal; and
a second output circuit connected to said delay circuit for outputting a second output signal to said output terminal in response to the decay signal, said second output circuit including,
a second high potential supplying circuit connected between said second high potential line and said output terminal for outputting the second high potential signal as the second output signal, and
a second low potential supplying circuit connected between said second low potential line and said output terminal for outputting the second low potential signal as the second output signal.

15. A buffer circuit of claim 14, wherein the first high potential supplying circuit has a high voltage threshold circuit electrically connected between said first high potential line and said output terminal for electrically disconnecting between them when the potential on said output terminal exceeds a high threshold voltage.

16. A buffer circuit of claim 15, wherein the high threshold voltage is intermediate between the potentials of the first high potential signal and the first low potential signal.

17. A buffer circuit of claim 14, wherein the first low potential supplying circuit has a low voltage threshold circuit electrically connected between said first low potential line and said output terminal for electrically disconnecting between them when the potential on said output terminals falls below a low threshold voltage.

18. A buffer circuit of claim 17, wherein the low threshold voltage is intermediate between the potentials of the first high potential signal and the first low potential signal.

* * * * *